(12) United States Patent
Miura et al.

(10) Patent No.: US 6,633,070 B2
(45) Date of Patent: Oct. 14, 2003

(54) SEMICONDUCTOR DEVICE

(75) Inventors: Naruhisa Miura, Tokyo (JP);
Toshiyuki Oishi, Tokyo (JP); Yuji Abe, Tokyo (JP); Kohei Sugihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/953,960

(22) Filed: Sep. 18, 2001

(65) Prior Publication Data
US 2002/0163036 A1 Nov. 7, 2002

(30) Foreign Application Priority Data
May 1, 2001 (JP) ............................. 2001-133841

(51) Int. Cl.[7] .................. H01L 29/76; H01L 29/94; H01L 31/062; H01L 31/113; H01L 31/119
(52) U.S. Cl. .................. 257/377; 257/382; 257/386; 257/412; 257/616; 257/384

(58) Field of Search ................ 257/377, 382, 257/384, 386, 900, 19, 412, 616

(56) References Cited

U.S. PATENT DOCUMENTS

| | | | | |
|---|---|---|---|---|
| 5,640,041 A | * | 6/1997 | Lur et al. | 257/510 |
| 5,683,924 A | * | 11/1997 | Chan et al. | 438/300 |
| 6,025,635 A | * | 2/2000 | Krivokapic | 257/288 |
| 6,489,215 B2 | * | 12/2002 | Mouli et al. | 438/400 |

OTHER PUBLICATIONS

Samavedam et al., "Elevated Source Drain Devices Using Silicon Selective Epitaxial Growth", Journal of Vacuum Science Technology B 18(3), May 2000, pp. 1244–1250.

* cited by examiner

Primary Examiner—Thien Tran
(74) Attorney, Agent, or Firm—Leydig, Voit & Mayer, Ltd.

(57) ABSTRACT

A field-effect transistor including a gate electrode, silicon layers, and source and drain regions at a surface of a silicon substrate. Sidewall insulating films on the opposite side surfaces of the gate electrode are located between the gate electrode and the silicon layers and contain respective voids.

10 Claims, 18 Drawing Sheets

SEMICONDUCTOR DEVICE

BACKGROUND OF THE INVENTION

1. Field of the Invention

The present invention relates to a semiconductor device and a method of manufacturing the same, and particularly relates to a semiconductor device provided with a field-effect transistor capable of fast operation as well as a method of manufacturing the same.

2. Description of the Background Art

A conventional semiconductor device provided with a field-effect transistor is manufactured as follows. As shown in FIG. 32, an element isolating region 103 and a well 102 are formed at a silicon substrate 101 or an SOI (Silicon on Insulator). Then, a silicon oxide film 104, which will form a gate insulating film, is formed on silicon substrate 101.

A polycrystalline silicon film, which is not shown and will form a gate electrode, is formed on silicon oxide film 104. A silicon oxide film (not shown) is formed on the polycrystalline silicon film. Predetermined photolithography and treatment are effected on the silicon oxide film to form a hard mask 106. Anisotropic etching is effected on the polycrystalline silicon film masked with hard mask 106 to form a gate electrode 105.

Then, as shown in FIG. 33, ions producing a predetermined conductivity type are implanted into well 102 masked with hard mask 106 and gate electrode 105 so that pocket regions 108a and 108b as well as extension regions 107a and 107b are formed. Thereafter, a heat treatment is performed. Then, a silicon oxide film and a silicon nitride film covering hard mask 106 and gate electrode 105 are successively formed on silicon substrate 101.

Then, as shown in FIG. 34, anisotropic etching is effected on the silicon oxide film and silicon nitride film thus formed so that silicon oxide films 109, which form sidewall insulating films, and silicon nitride films 110 are formed on the side surfaces of gate electrode 105 and hard mask 106.

Then, as shown in FIG. 35, a silicon selective epitaxial growth method is perform to form silicon layers 111a and 111b on exposed surfaces of extension regions 107a and 107b, respectively. Then, as shown in FIG. 36, impurities producing a predetermined conductivity type are implanted into silicon layers 111a and 111b by an ion implanting method, as shown in FIG. 36. Thereafter, heat treatment is effected form source/drain regions 112a and 112b at well 102.

In this manner, a major portion of the semiconductor device provided with the field-effect transistors is formed. In the method of manufacturing the semiconductor device described above, impurities implanted into silicon layers 111a and 111b are diffused by the heat treatment into the regions of silicon substrate 101 (well 102) so that source/drain regions 112a and 112b are formed. Thereby, source/drain regions 112a and 112b have a relatively small depth, which improves the short-channel characteristics of the field-effect transistor.

However, the method of manufacturing the semiconductor device described above suffers from the following problem. Since silicon layers 111a and 111b are formed on the surface of silicon substrate 102 (extension regions 107a and 107b), a large fringing capacitance (parasitic capacitance) occurs between silicon layers 111a and 111b and gate electrode 105. As a result, it is difficult to improve further the operation speed of the field-effect transistor.

SUMMARY OF THE INVENTION

The invention has been developed for overcoming the above problem, and it is an object of the invention to provide a semiconductor device capable of faster operation. Another object of the invention is to provide a method of manufacturing the semiconductor device.

A semiconductor device according to an aspect of the invention includes a gate electrode, sidewall insulating films and source/drain regions. The gate electrode is formed on a surface of a semiconductor substrate with a gate insulating film therebetween. The sidewall insulating films are formed on opposite side surfaces of the gate electrode, respectively. The source/drain regions are formed on one and the other of regions of the semiconductor substrate spaced from each other with the gate electrode and the sidewall insulating films therebetween, and each include a portion formed at the surface of the semiconductor substrate and a raised portion formed on the surface of the portion formed at the semiconductor substrate surface. The sidewall insulating film is provided at its portion located between the raised portion and the gate electrode with a void.

According to the above structure, the void is formed in the portion of the sidewall insulating film located between the raised portion of each of the source/drain regions and the gate electrode in the field-effect transistor. Since the dielectric constant of the void is much lower than that of a bulk of the sidewall insulating film, parasitic capacitances (fringing capacitances) between the source/drain regions and the gate electrode are smaller than that in a structure not provided with the void in the sidewall insulating film. As a result, the operation speed of the field-effect transistor can be improved.

Preferably, the raised portion has a height substantially two or more times larger than a thickness of the sidewall insulating film on the surface of the semiconductor substrate.

This can suppress such a situation that a material gas reaches a deep position in the space between the raised portion and the gate electrode when forming the film for the sidewall insulating film, and thus allows easy formation of the void in this portion.

Preferably, the gate electrode has a wide portion located closer to the raised portion.

This structure reduces a distance between the raised portion and the wide portion of the gate electrode, and allows easy formation of the void between the lower portion of the raised portion and the lower portion of the gate electrode.

More preferably, the gate electrode is formed of at least two layers, and the upper layer of the two layers includes the wide portion.

In the above structure, the gate electrode is formed of the two layers having different characteristics. Therefore, the wide portion can be easily formed.

In the above structure, it is preferable that the upper layer of the gate electrode is made of silicon, and the lower layer is made of silicon germanium, or that the upper layer of the gate electrode contains metal, and the lower layer contains a semiconductor layer.

More preferably, the wide portion has the lower end located at the level equal to or lower than the top surface of the raised portion.

This structure allows easy formation of the void at the level lower than the lower end of the wide portion.

Preferably, the semiconductor device includes an interlayer insulating film formed on the semiconductor substrate and covering the sidewall insulating films and the source/ drain regions, and the interlayer insulating film has the top surface located closer to the gate electrode.

This structure further reduces the distance between the top portion of the interlayer insulating film and the gate electrode, and allows easy formation of the void having relatively large sizes and located in and between the lower and upper portions of the gate electrode when forming the sidewall insulating film.

More preferably, the gate electrode is made of metal.

This can reduce the resistance of the gate electrode.

A method of manufacturing a semiconductor device according to another aspect of the invention includes the following steps. A gate electrode is formed on a surface of a semiconductor substrate. A dummy sidewall insulating film is formed on each of the opposite side surfaces of the gate electrode. Impurity regions partially forming source/ drain regions are formed on one and the other of regions of the semiconductor substrate spaced from each other with the gate electrode and the sidewall insulating films therebetween. Raised portions partially forming the source/drain regions are formed on the surfaces of the impurity regions, respectively. After forming the raised portions, the dummy sidewall insulating films are removed. After removing the dummy sidewall insulating films, sidewall insulating films are formed on the side surfaces of the gate electrode, respectively. The step of forming the sidewall insulating film is performed to form a void in a region between the raised portion and the gate electrode by suppressing supply of a material of the sidewall insulating film to the region between the raised portion and the gate electrode.

According to this manufacturing method, supply of the material of the sidewall insulating film to the region between the raised portion and the gate electrode is suppressed, whereby the void can be easily formed in this region of the sidewall insulating film, and thereby parasitic capacitances (fringing capacitances) between the source/drain regions and the gate electrode are reduced in the field-effect transistor. As a result, the operation speed of the field-effect transistor can be increased.

Preferably, the step of forming the dummy sidewall insulating film is performed to form the dummy sidewall insulating film provided with a wide portion extending from a surface of the semiconductor substrate to a predetermined height and having a larger film thickness than the other portion, and the step of forming the raised portion is performed to provide the raised portion extending beyond the wide portion.

This method further reduces the distance between the top surface portion of the raised portion and the gate electrode, and the void can be easily formed between the raised portion and the gate electrode when forming the sidewall insulating film.

More preferably, the method includes the step of removing a portion of the raised portion extending beyond the wide portion after forming the sidewall insulating film.

Thereby, a portion of the raised portion located closer to the gate electrode is removed so that the parasitic capacitance between the source or drain region and the gate electrode can be further reduced.

Preferably, the method includes, after the step of forming the raised portion and before the step of removing the dummy sidewall insulating film, the steps of forming an interlayer insulating film covering the gate electrode, the dummy sidewall insulating film and the raised portion, and processing the interlayer insulating film to expose the gate electrode and the dummy sidewall insulating film, and the step of removing the dummy sidewall insulating film is performed to remove the dummy sidewall insulating film by effecting etching on the exposed portion of the dummy sidewall insulating film.

This method further reduces the distance, which is defined between the top surface of the interlayer insulating film and the gate electrode, of the space formed between the interlayer insulating film and the gate electrode by removing the dummy sidewall insulating film, and allows easy formation of the relatively large void in a region located in and between the lower and upper portions of the gate electrode when forming the sidewall insulating film.

More preferably, the method includes, after the step of exposing the gate electrode and the dummy sidewall insulating film and before the step of removing the dummy sidewall insulating film, the steps of removing the gate electrode to expose the surface of the semiconductor substrate, and forming a new gate electrode including a metal film on the exposed surface of the semiconductor substrate, and the step of removing the dummy sidewall insulating film is performed to remove the dummy sidewall insulating film by effecting etching on a portion of the dummy sidewall insulating film exposed and located between the new gate electrode and the interlayer insulating film.

In this case, the gate electrode, which is first formed, is a dummy, and the gate electrode formed later is the actual gate electrode. By removing the dummy sidewall insulating film, the distance determined between the top surface of the interlayer insulating film and the gate electrode is reduced in the space formed between the interlayer insulating film and the actual gate electrode, and the relatively large void can be easily formed in a region located in and between the lower and upper portions of the actual gate electrode. Since the actual gate electrode is formed after forming the source/ drain regions, a gate insulating film of a relatively high dielectric constant can be employed. Since the gate electrode includes the metal film, the resistance of the gate electrode can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
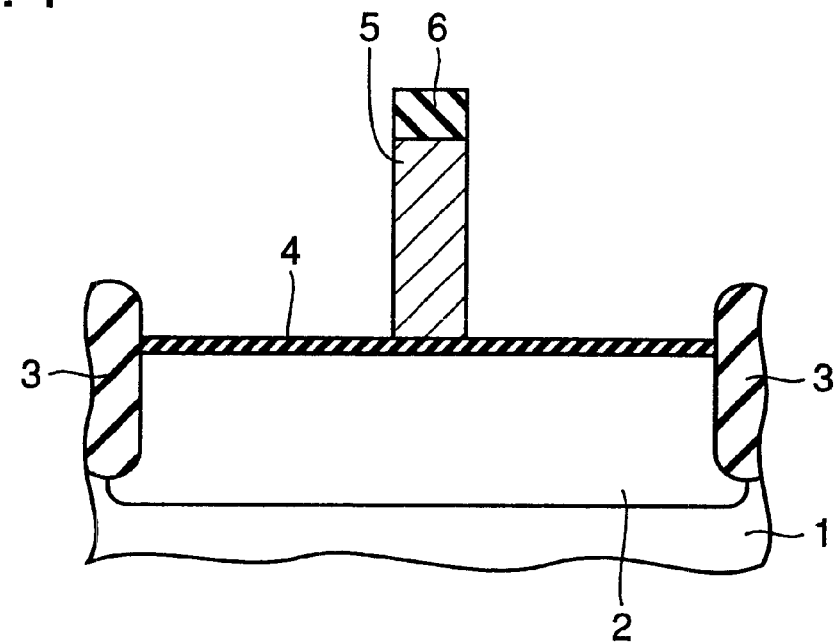
FIG. 1 is a cross section showing a step in a method of manufacturing a semiconductor device according to a first embodiment of the invention.

Description will now be given on a method of manufacturing a semiconductor device according to a first embodiment of the invention as well as the semiconductor device manufactured by the method. First, as shown in FIG. 1, an element isolation region 3 and a well 2 are formed at a surface of a silicon substrate 1. A silicon oxide film 4, which will form a gate insulating film, is formed at the surface of silicon substrate 1.

A polycrystalline silicon film, which is not shown and will form a gate electrode, is formed on silicon oxide film 4. Another silicon oxide film is formed on the polycrystalline silicon film thus formed. Predetermined photolithography and etching are effected on the silicon oxide film to form a hard mask 6. Anisotropic etching is effected on the polycrystalline silicon film masked with hard mask 6 so that a gate electrode 5 is formed.

Figure 2:
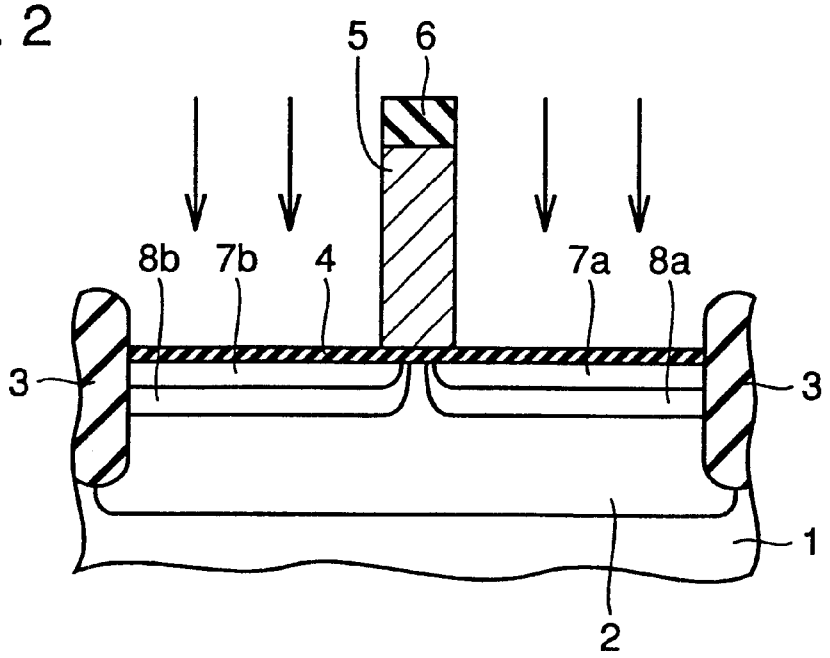
FIG. 2 is a cross section showing a step following the step shown in FIG. 1 in the first embodiment.

Then, as shown in FIG. 2, impurities of a predetermined conductivity type are implanted into well 2 by an ion implanting method to form pocket regions 8a and 8b as well as extension regions 7a and 7b.

Thereafter, a silicon oxide film and a silicon nitride film are successively formed over hard mask 6 and gate electrode 5.

Figure 3:
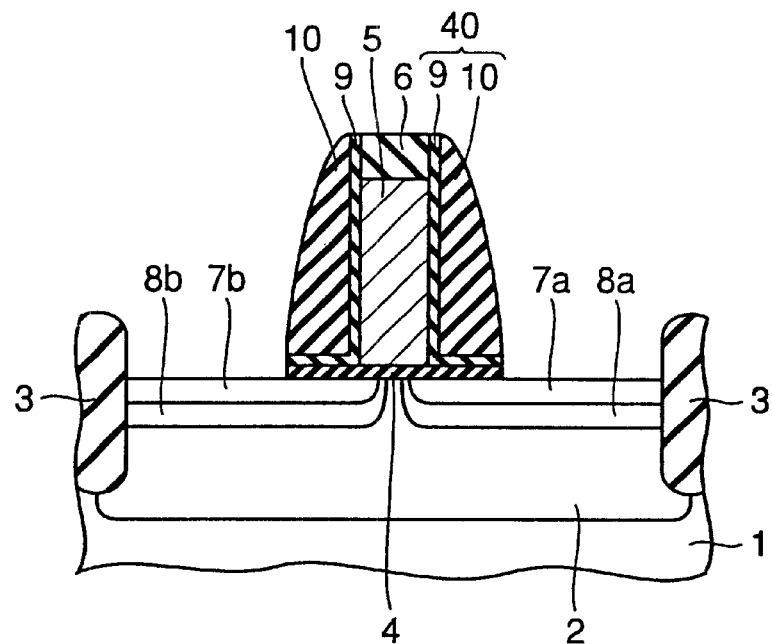
FIG. 3 is a cross section showing a step following the step shown in FIG. 2 in the first embodiment.

Then, as shown in FIG. 3, anisotropic etching is effected on the silicon nitride film and the silicon oxide film so that silicon oxide films 9 and silicon nitride films 10 serving as sidewall insulating films 40 are formed on the side surfaces of gate electrode 5 and hard mask 6.

Figure 4:
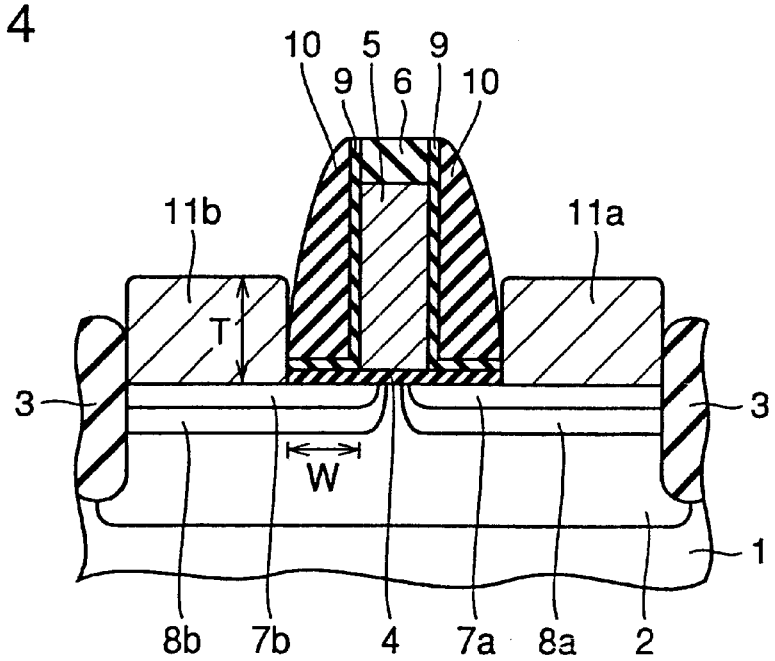
FIG. 4 is a cross section showing a step following the step shown in FIG. 3 in the first embodiment.

Then, as shown in FIG. 4, silicon layers 11a and 11b or the like are formed on extension regions 7a and 7b having exposed surfaces by a silicon selective epitaxial growth method, respectively. Each of silicon layers 11a and 11b preferably has a thickness T, which is two or more times larger than a width W of each of sidewall insulating films 9 and 10. Silicon layers 11a and 11b may contain germanium or carbon as a matrix.

Figure 5:
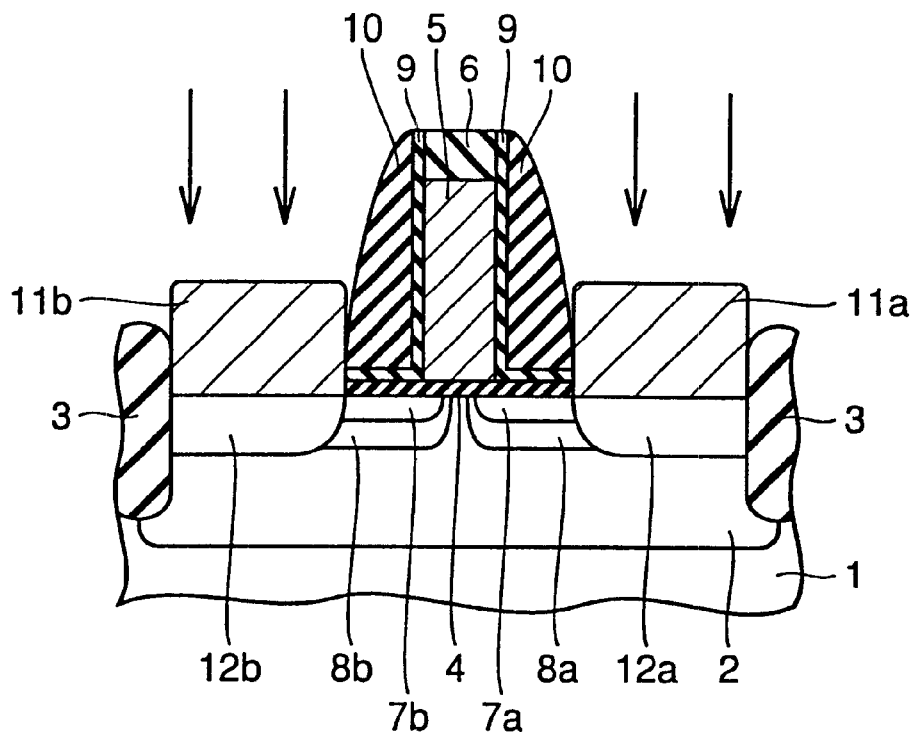
FIG. 5 is a cross section showing a step following the step shown in FIG. 4 in the first embodiment.

Then, as shown in FIG. 5, impurities of a predetermined conductivity type are implanted into silicon layers 11a and 11b by an ion implanting method. Thereafter, heat treatment is effected to diffuse the impurities implanted into silicon layers 11a and 11b to form source/drain regions 12a and 12b, respectively. Silicon layers 11a and 11b as well as source/drain regions 12a and 12b form the substantial source/drain regions in the field-effect transistor.

Figure 6:
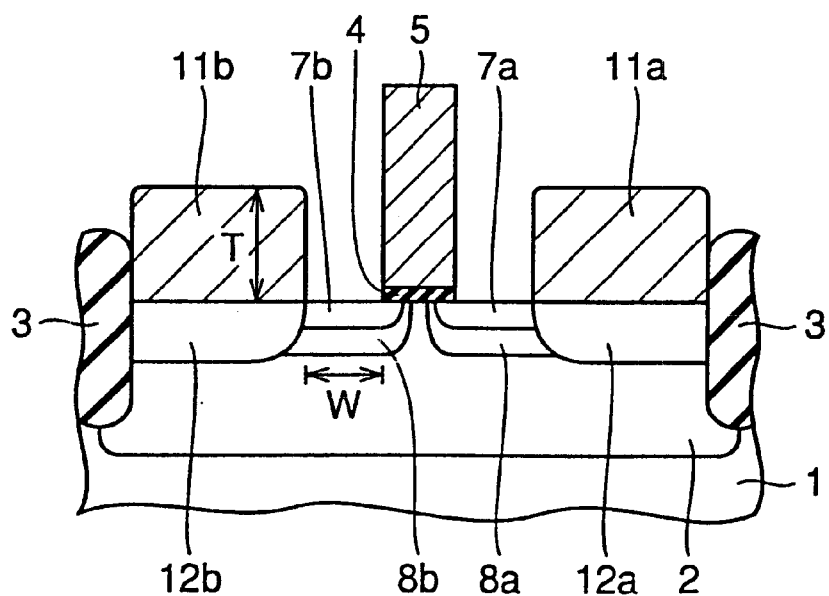
FIG. 6 is a cross section showing a step following the step shown in FIG. 5 in the first embodiment.
Figure 7:
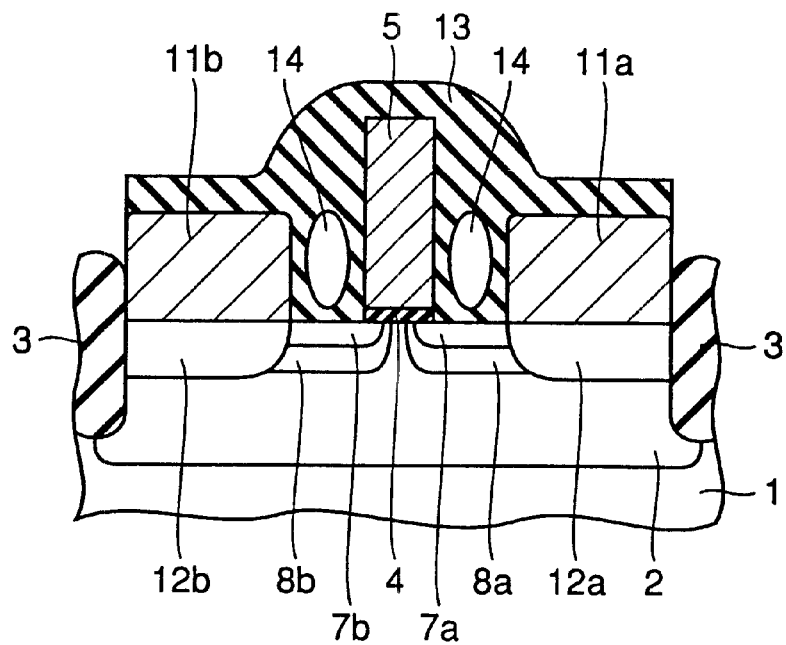
FIG. 7 is a cross section showing a step following the step shown in FIG. 6 in the first embodiment.
Figure 8:
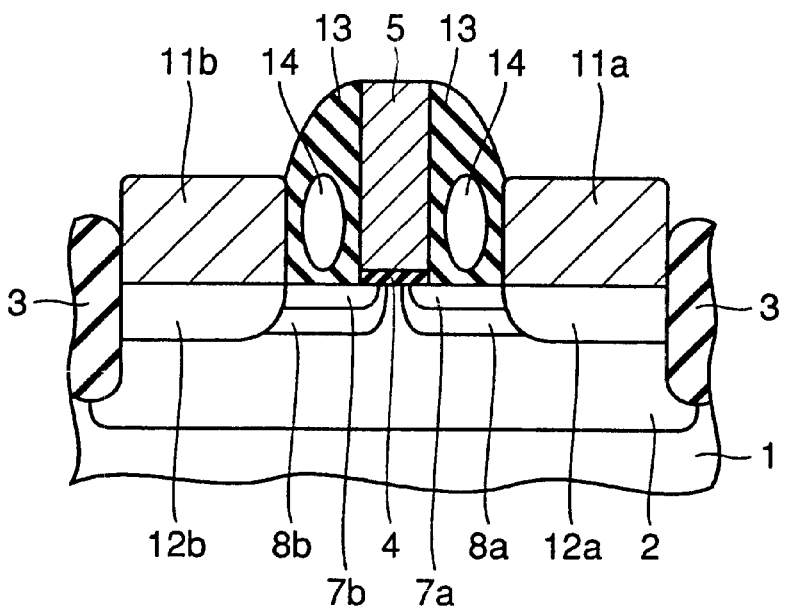
FIG. 8 is a cross section showing a step following the step shown in FIG. 7 in the first embodiment.

Then, as shown in FIG. 6, wet etching is effected to remove silicon nitride film 10 and silicon oxide film 9. Then, as shown in FIG. 7, a silicon oxide film 13 covering silicon layers 11a and 11b as well as gate electrode 5 is formed. For this formation, thermal CVD (Chemical Vapor Deposition) is preferably performed, e.g., at a temperature of 750° C. or more.

In this method, it is possible to change deposition rates of silicon oxide film 13 in horizontal and vertical directions on silicon substrate 1, and a void 14 can be formed in a portion located between gate electrode 5 and each of silicon layers 11a and 11b. Since each of silicon layers 11a and 11b has thickness T two or more times large than a distance or width W of the space between each of silicon layers 11a and 11b and gate electrode 5, an aspect ratio, i.e., a ratio of the width W of this space with respect to height T is relatively large. This promotes formation of void 14.

Thereafter, anisotropic etching is effected on silicon oxide film 13 to form sidewall insulating films 13 as shown in FIG.

8. Thereby, sidewall insulating films 13 each having void 14 between silicon layer 11a or 11b and gate electrode 5 are formed as the sidewall insulating films on the opposite side surfaces of gate electrode 5, respectively.

Since sidewall insulating films 13 located between silicon layers 11a and 11b and gate electrode 5 are provided with voids 14, respectively, fringing capacitances between silicon layers 11a and 11b and gate electrode 5 are reduced as compared with a structure not provided with such a void. Consequently, the operation speed of the field-effect transistor can be further increased.

Since source/drain regions 12a and 12b are formed by diffusing impurities, which were implanted into silicon layers 11a and 11b, into well 2, the depths of source/drain regions 12a and 12b are relatively small so that the short channel effect can be improved.

In the example of the method of manufacturing the semiconductor device described above, the silicon oxide film is employed as sidewall insulating film 13. Instead of the silicon oxide film, a silicon nitride film or a silicon oxide and nitride film may be employed as the sidewall insulating film. Further, an insulating film made of a material having a lower relative dielectric constant than the silicon oxide film may be employed. A multilayer film including these films layered together may be employed.

The thermal CVD method has been described as an example of the method of forming sidewall insulating film 13. However, a plasma CVD method or a HDP (High Density Plasma) CVD method may be employed. Coating in a spin coat method may be used.

Second Embodiment

Figure 9:
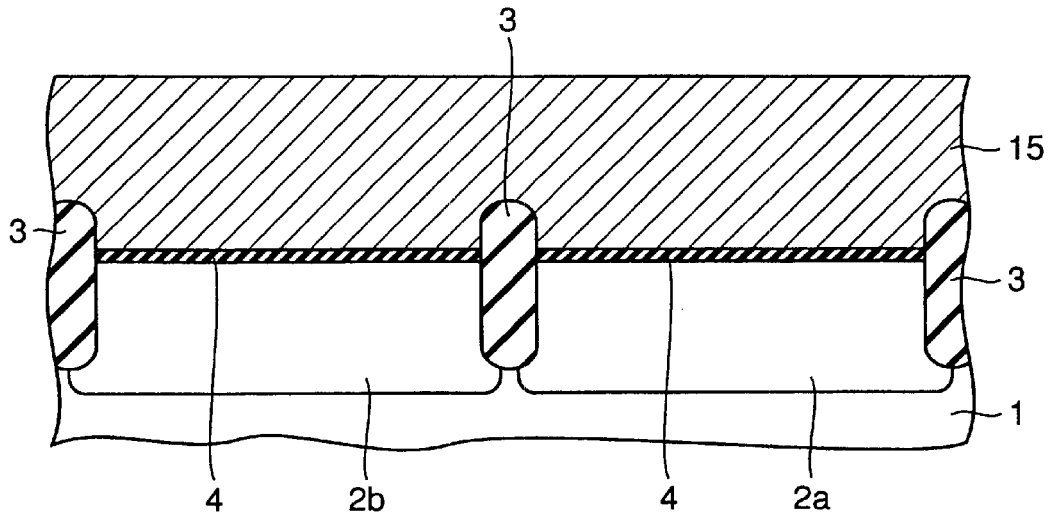
FIG. 9 is a cross section showing a step in a method of manufacturing a semiconductor device according to a second embodiment of the invention.

Description will now be given on a method of manufacturing a semiconductor device according to a second embodiment of the invention as well as the semiconductor device manufactured by the method. First, as shown in FIG. 9, element isolation region 3 is formed at silicon substrate 1. Then, wells 2a and 2b of different conductivity types are formed. Silicon oxide film 4, which will form a gate insulating film, is formed at silicon substrate 1. A polycrystalline silicon film 15, which will form a gate electrode, is formed on silicon oxide film 4.

Figure 10:
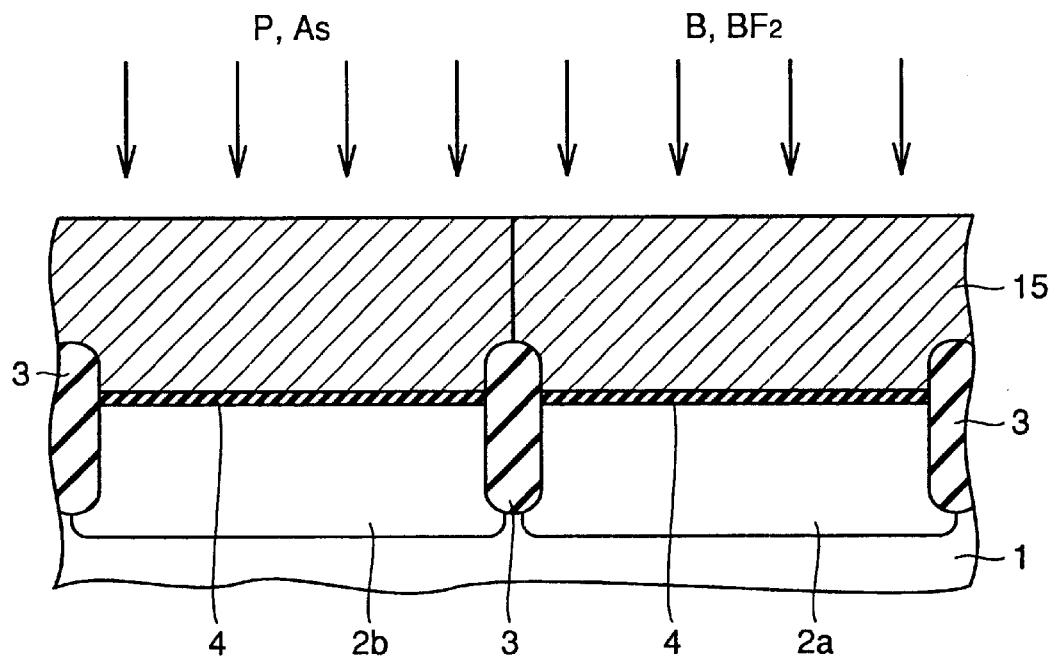
FIG. 10 is a cross section showing a step following the step shown in FIG. 9 in the second embodiment.

Then, as shown in FIG. 10, phosphorus or arsenic is implanted by an ion implanting method into polycrystalline silicon film 15 located in an nMOSFET region. Boron or boron difluoride is implanted by the ion implanting method into polycrystalline silicon film 15 located in a pMOSFET region.

For implanting the phosphorus or arsenic, a resist mask (not shown) is formed on polycrystalline silicon film 15 located in the pMOSFET region. For implanting the boron or boron difluoride, a resist film (not shown) is formed on polycrystalline silicon film 15 located in the nMOSFET region.

Figure 12:
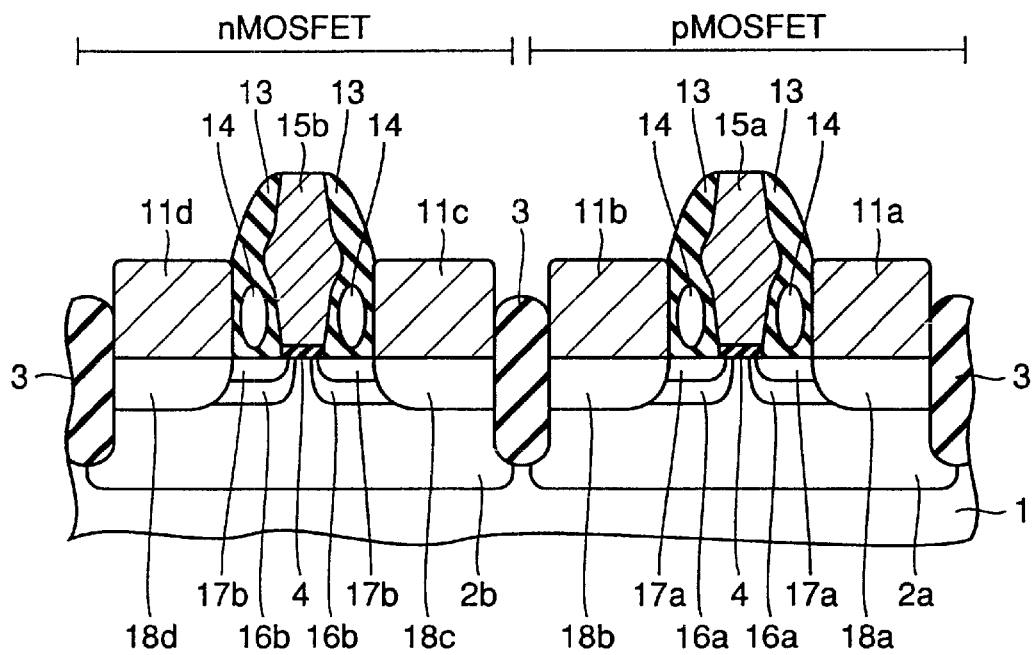
FIG. 12 is a cross section showing a step following the step shown in FIG. 11 in the second embodiment.

Desirably, these impurities are implanted under such conditions that the concentration profile of the impurities implanted in polycrystalline silicon film 15 has a peak at the substantially same level as top surfaces of silicon layers 11a–11d (see FIG. 12), which will be formed in later steps.

Thereafter, a silicon oxide film, which is not shown and will form a hard mask, is formed on polycrystalline silicon film 15. Predetermined photolithography and etching are effected on the silicon oxide film to form hard mask 6.

Figure 11:
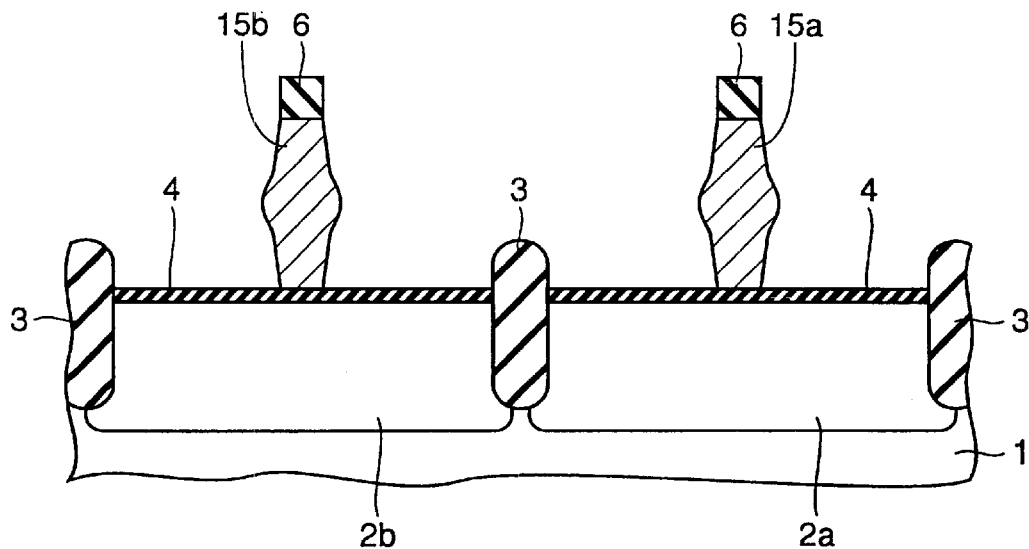
FIG. 11 is a cross section showing a step following the step shown in FIG. 10 in the second embodiment.

Then, as shown in FIG. 11, predetermined etching is effected on polycrystalline silicon film 15 masked with hard mask 6 to form gate electrodes 15a and 15b. This predetermined etching is performed at a low etching rate in a portion of polycrystalline silicon film 15 having a relatively high impurity concentration, and is performed at a relatively high etching rate in a portion having a low impurity concentration. As a result, gate electrodes 15a and 15b each having a barrel-like form are formed.

For such etching, it is desired to perform reactive ion etching, e.g., under such conditions that the pressure is several milli-torrs (up to several pascals), an etching gas containing halogen compound, oxygen and others is supplied at a flow rate of 30–100 sccm (0.03–0.1 L/min) and an RF power is approximately between 20 and 200 W.

Thereafter, steps similar to those of the first embodiment shown in FIGS. 2 to 8 are performed so that an n-channel field-effect transistor is formed in the nMOSFET region of silicon substrate 1, and a p-channel field-effect transistor is formed in a pMOSFET region.

According to this method of manufacturing the semiconductor device, barrel-shaped gate electrodes 15a and 15b are present when forming sidewall insulating films 13. Therefore, the distances between gate electrodes 15a and 15b and silicon layers 11a–11d are reduced so that voids 14 can be easily formed between the lower portions of silicon layers 11a–11d and the lower portions of gate electrodes 15a and 15b.

This is owing to the following fact. Since the distances between the upper portions of silicon layers 11a–11d and the middle portions of gate electrodes 15a and 15b are reduced, a material gas cannot easily reach a deep portion in each of the spaces between silicon layers 11a–11d and gate electrodes 15a and 15b when forming the silicon oxide films, which will form sidewall insulating films 13. Since the portion of the reduced distance is covered or filled with the silicon oxide film before the deep portion of the space is filled with the silicon oxide film, it is difficult to supply the material gas to the deep portion so that void 14 is formed.

Thereby, as already described in connection with the first embodiment, the fringing capacitances between silicon layers 11a–11d and gate electrodes 15a and 15b can be reduced, and the operation speed of the field-effect transistor can be increased.

Side wall insulating film 13 may be a silicon nitride film or a silicon oxide and nitride film, as already described in connection with the first embodiment. Side wall insulating film 13 may be formed in the plasma CVD method, HDPCVD method or the like.

In this semiconductor device, since each of gate electrodes 15a and 15b has the middle portion wider than the upper and lower portions, the gate electrode has an increased cross section, and therefore can have a reduced resistance.

Third Embodiment

Figure 13:
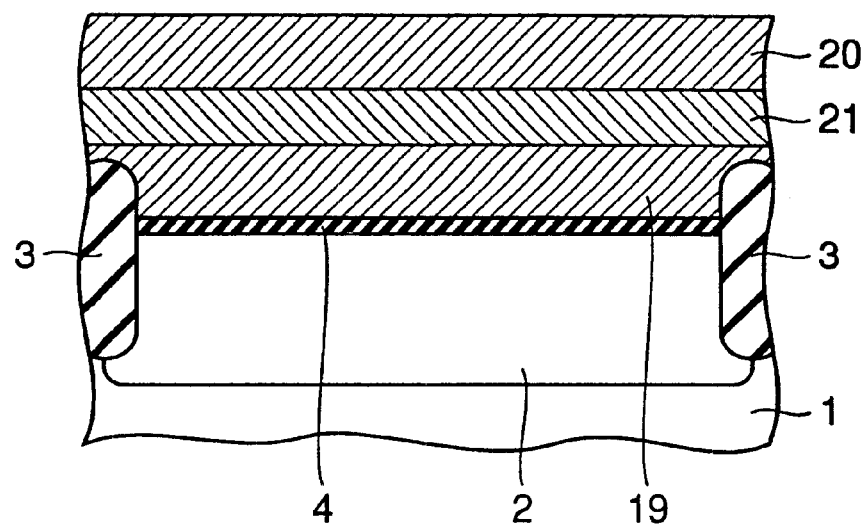
FIG. 13 is a cross section showing a step in a method of manufacturing a semiconductor device according to a third embodiment of the invention.

Description will now be given on a method of manufacturing a semiconductor device according to a third embodiment of the invention as well as a semiconductor device manufactured by the method. First, as shown in FIG. 13, element isolating region 3 and well 2 are formed at the surface of silicon substrate 1. Silicon oxide film 4, which will form a gate insulating film, is formed at the surface of silicon substrate 1.

A silicon germanium film 19 is formed on silicon oxide film 4. A silicon film 21 is formed on silicon germanium film 19. A silicon germanium film 20 is formed on silicon germanium film 21. Thereafter, a silicon oxide film, which is not shown and will form a hard mask, is formed on germanium film 20. Predetermined photolithography and etching are effected on the silicon oxide film to form hard mask 6.

Figure 14:
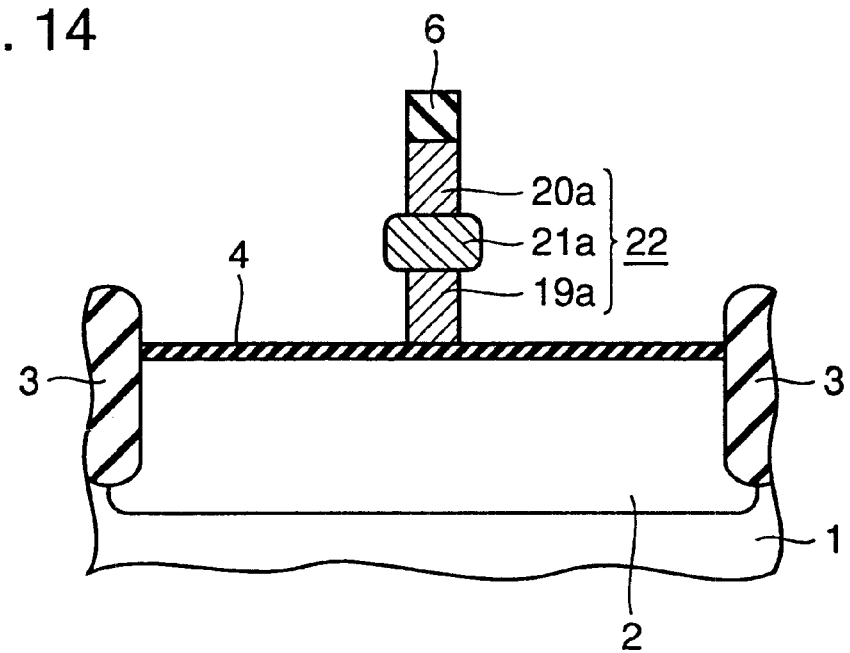
FIG. 14 is a cross section showing a step following the step shown in FIG. 13 in the third embodiment.
Figure 15:
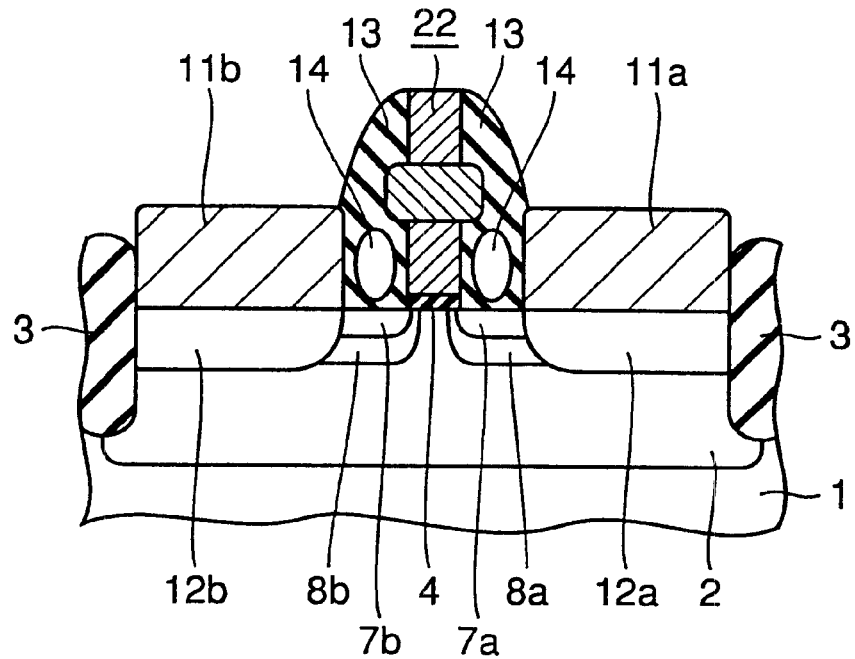
FIG. 15 is a cross section showing a step following the step shown in FIG. 14 in the third embodiment.

Then, as shown in FIG. 14, predetermined etching is effected on silicon germanium films 19 and 20 as well silicon film 21 masked with hard mask 6 to form a gate electrode 22. For this formation, such conditions are employed that the etching rate of silicon film 21 is lower than the etching rates of silicon germanium films 19 and 20. Thereby, a portion formed of silicon film 21a in gate electrode 22 has a larger width than portions formed of silicon germanium films 19a and 20a.

For such etching, it is desired to perform reactive ion etching, e.g., under such conditions that the pressure is several milli-torrs (up to several pascals), an etching gas containing halogen compound, oxygen and others is supplied at a flow rate of 30–100 sccm (0.03–0.1 L/min) and an RF power is approximately between 20 and 200 W.

Thereafter, steps similar to those of the first embodiment shown in FIGS. 2 to 8 are performed so that sidewall insulating films 13 formed on the side surfaces of gate electrode 22 are provided with voids 14 located between silicon layers 11a and 11b and gate electrode 22, respectively.

In particular, it is desired that the top surfaces of silicon layers 11a and 11b are located at the level equal to or higher than the lower end of the portion of silicon film 21a in gate electrode 22. According to this structure, the distances between silicon layers 11a and 11b and silicon film 21a are smaller than those between silicon layers 11a and 11b and silicon germanium film 19a.

Thereby, a material gas cannot easily reach a deep portion in each of the spaces between silicon layers 11a and 11b and gate electrode 22 when forming sidewall insulating films 13. Since the portion between each of silicon layers 11a and 11b and silicon film 21a is covered or filled with the silicon oxide film before the deep portion of the space is filled with the silicon oxide film, it is difficult to supply the material gas to the deep portion of the space so that void 14 is formed.

Thereby, as already described in connection with the first embodiment, the fringing capacitances between silicon layers 11a and 11b and gate electrode 22 can be reduced, and the operation speed of the field-effect transistor can be increased. Since gate electrode 22 has the wide portion formed of silicon film 21a, the resistance of gate electrode 22 can be reduced.

Since silicon germanium films 19a and 20a are used as gate electrode 22, diffusion of boron occurs to a smaller extent than silicon. Therefore, such a disadvantageous situation can be particularly suppressed that the heat treatment for forming source/drain regions 12a and 12b moves the boron, which is present within the gate electrode of the p-channel field-effect transistor, through gate insulating film 4, and thereby changes the threshold voltage of the field-effect transistor.

Fourth Embodiment

Figure 16:
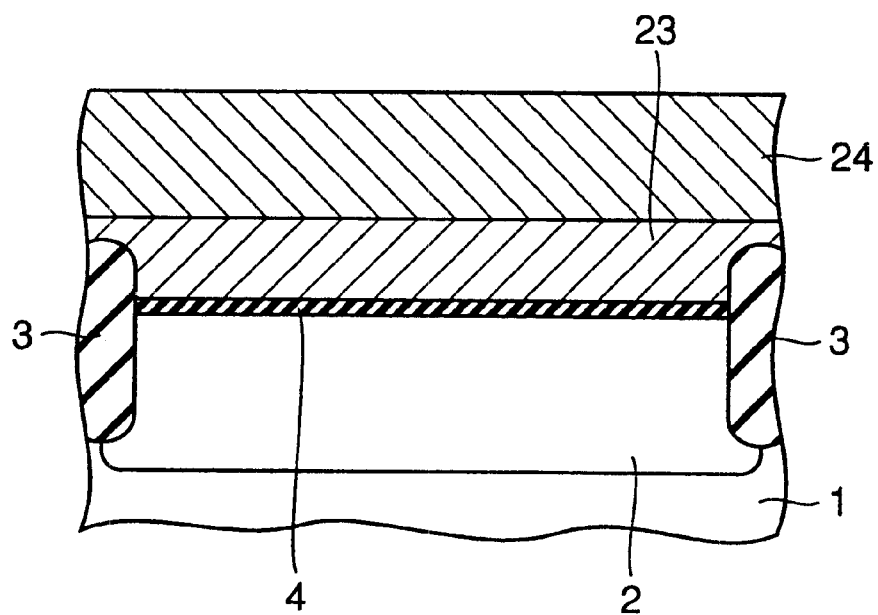
FIG. 16 is a cross section showing a step in a method of manufacturing a semiconductor device according to a fourth embodiment of the invention.

Description will now be given on a method of manufacturing a semiconductor device according to a fourth embodiment of the invention as well as the semiconductor device manufactured by the method. First, as shown in FIG. 16, element isolating region 3 and well 2 are formed at the surface of silicon substrate 1. Silicon oxide film 4, which will form a gate insulating film, is formed at the surface of silicon substrate 1.

A polycrystalline silicon film 23 is formed on silicon oxide film 4. A tungsten film 24 or the like is formed on polycrystalline silicon film 23. Instead of the tungsten film, a metal film of copper or the like may be formed. The metal film may contain silicon or nitrogen as a matrix. Germanium or carbon may be added as a matrix to polycrystalline silicon film 23.

Thereafter, a silicon oxide film, which is not shown and will form a hard mask, is formed on tungsten film 24. Predetermined photolithography and etching are effected on the silicon oxide film to form hard mask 6.

Figure 17:
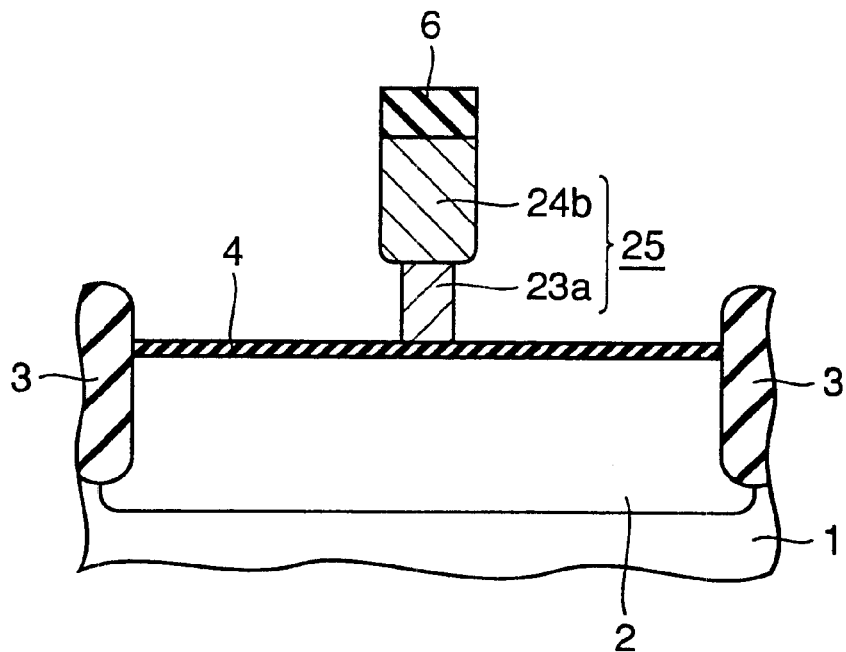
FIG. 17 is a cross section showing a step following the step shown in FIG. 16 in the fourth embodiment.
Figure 18:
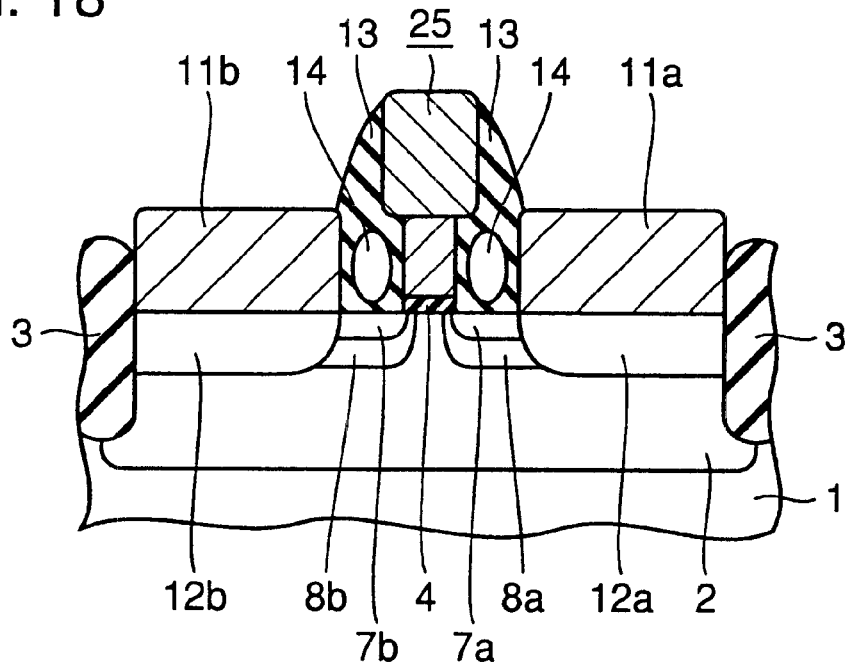
FIG. 18 is a cross section showing a step following the step shown in FIG. 17 in the fourth embodiment.
Figure 19:
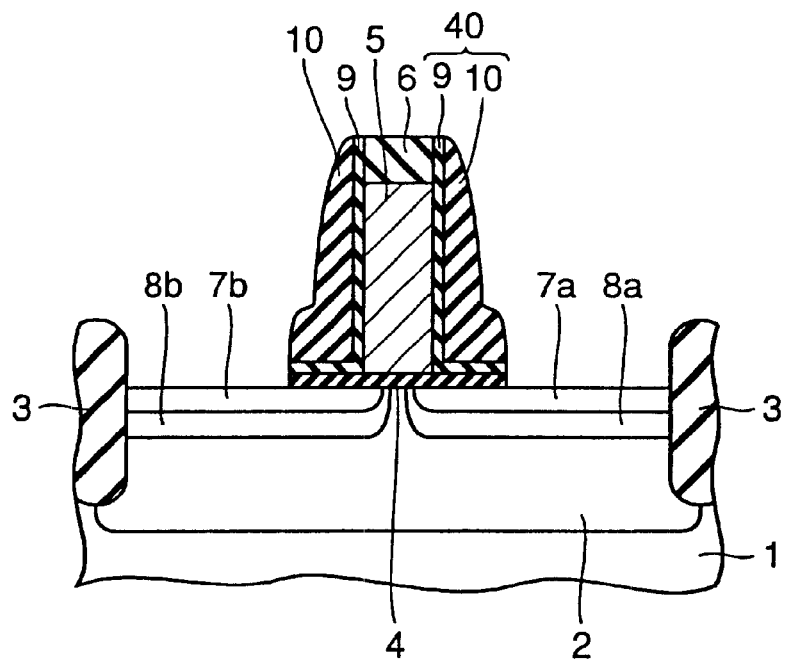
FIG. 19 is a cross section showing a step in a method of manufacturing a semiconductor device according to a fifth embodiment of the invention.

Then, as shown in FIG. 17, etching is effected on tungsten film 24 and polycrystalline silicon film 23 masked with hard mask 6 to form a gate electrode 25. For this formation, such conditions are employed that the etching rate of tungsten film 24 is lower than the etching rate of polycrystalline silicon film 23. Thereby, a portion formed of etched tungsten film 24a has a larger width than a portion formed of polycrystalline silicon film 23a.

For such etching, it is desired to perform reactive ion etching, e.g., under such conditions that the pressure is in a range from several milli-torrs to several torrs (some tenths to hundreds of pascals), an etching gas containing halogen compound, oxygen and others is supplied at a flow rate of 30–200 sccm (0.03–0.2 L/min) and an RF power is approximately between 20 and 500 W.

Thereafter, steps similar to those of the first embodiment shown in FIGS. 2 to 8 are performed so that sidewall insulating films 13 formed on the side surfaces of gate electrode 25 are provided with voids 14 located between silicon layers 11a and 11b and gate electrode 25, respectively.

In particular, it is desired that the top surfaces of silicon layers 11a and 11b are located at the level equal to or higher than the lower end of the portion of tungsten film 25a of gate electrode 25. According to this structure, each of the spaces between silicon layers 11a and 11b and gate electrode 25 has the upper portion narrower than the lower portion.

Thereby, a material gas cannot easily reach a deep portion in each of the spaces between silicon layers 11a and 11b and gate electrode 25 when forming sidewall insulating films 13. Since the upper portion of each of the spaces between silicon layers 11a and 11b and gate electrode 25 is covered or filled with the silicon oxide film before the deep portion of the space is filled with the silicon oxide film, the material gas cannot be supplied to the deep portion of the space so that void 14 is formed.

Thereby, as already described in connection with the first embodiment, the fringing capacitances between silicon layers 11a and 11b and gate electrode 25 can be reduced, and the operation speed of the field-effect transistor can be increased. Since gate electrode 25 has a middle portion formed of tungsten film 24, the resistance of gate electrode 25 can be reduced.

Fifth Embodiment

Description will now be given on a method of manufacturing a semiconductor device according to a fifth embodiment of the invention as well as the semiconductor device manufactured by the method. First, steps similar to those of the first embodiment shown in FIGS. 1 to 3 are performed to form dummy sidewall insulating films 40 on the side surfaces of gate electrode 5 and hard mask 6. In this processing, predetermined etching is performed to form sidewall insulating film 40 having silicon nitride film 10, which has an upper portion etched to a larger extent than a lower portion.

For such etching, it is desired to perform reactive ion etching, e.g., under such conditions that the pressure is equal to 100 mTorr (0.1 Pa), an etching gas containing halogen compound, oxygen and others is supplied at a flow rate of 100–500 sccm (0.01–0.5 L/min), an RF power is approximately between 100 and 500 W and overetching at 20–30% is performed.

Figure 20:
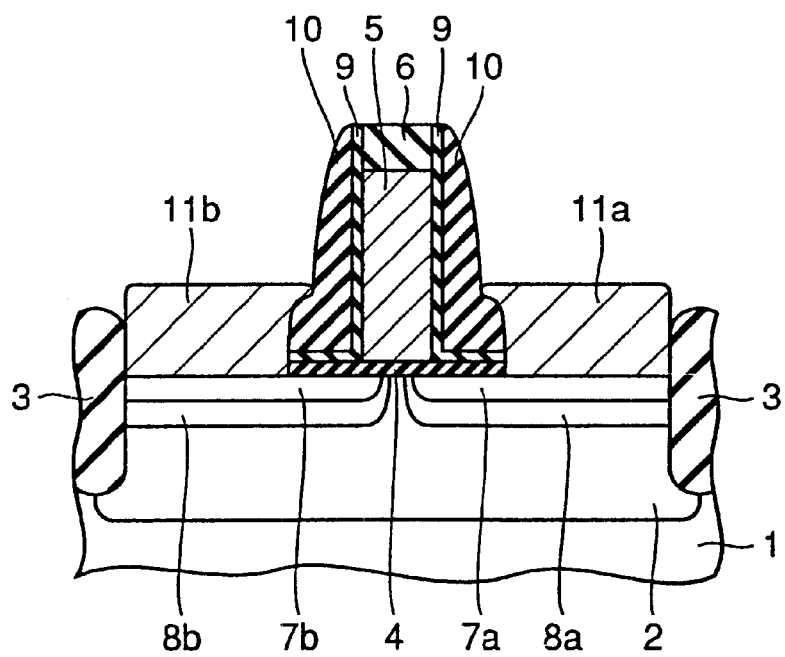
FIG. 20 is a cross section showing a step following the step shown in FIG. 19 in the fifth embodiment.

Then, as shown in FIG. 20, silicon layers 11a and 11b are formed on extension regions 7a and 7b having exposed surfaces by the silicon selective epitaxial growth method, respectively. This processing is performed under such conditions that the growth rate in the horizontal direction of silicon substrate 1 is at the level equal to the growth rate in the vertical direction of silicon substrate 1. Thereby, silicon layers 11a and 11b can be formed along the surfaces of the concave portions of sidewall insulating films 40, respectively. Silicon layers 11a and 11b may contain germanium or carbon as a matrix.

Figure 21:
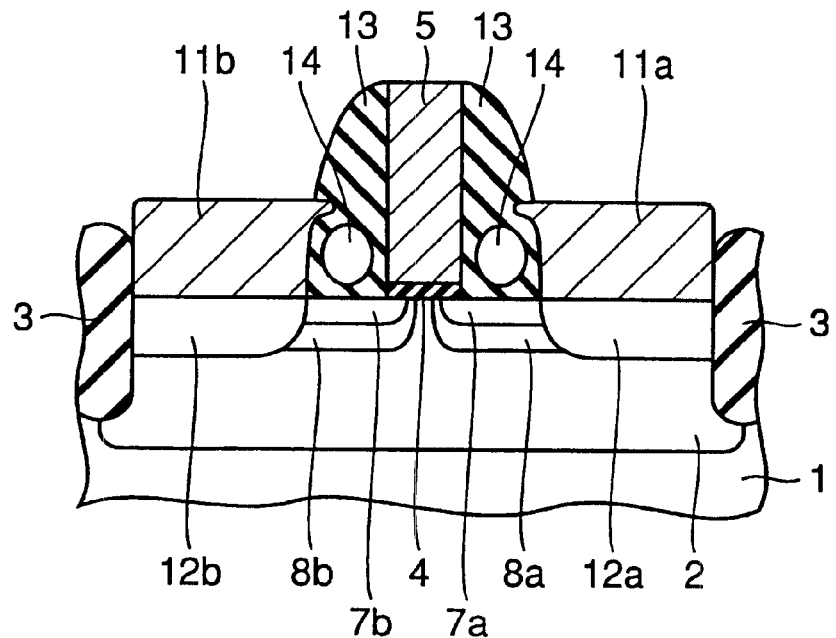
FIG. 21 is a cross section showing a step following the step shown in FIG. 20 in the fifth embodiment.

Thereafter, steps similar to those of the first embodiment shown in FIGS. 5 to 8 are performed so that voids 14 are formed in sidewall insulating films 13 as shown in FIG. 21, respectively.

In the method of manufacturing the semiconductor device described above, the top surface portions of silicon layers 11a and 11b are located closer to gate electrode 5 than other portions. Accordingly, the distances between the top surface portions of silicon layers 11a and 11b and gate electrode 25 are smaller than those between the other portions.

Thereby, a material gas cannot easily reach a deep portion in each of the spaces between silicon layers 11a and 11b and gate electrode 25 when forming the silicon oxide films for forming sidewall insulating films 13. Since the portion between each of the top surface portions of silicon layers 11a and 11b and gate electrode 5 is covered or filled with the silicon oxide film before the deep portion of the space is filled with the silicon oxide film, it is difficult to supply the material gas to the deep portion of the space so that void 14 is formed.

Thereby, as already described in connection with the first embodiment, the fringing capacitances between silicon layers 11a and 11b and gate electrode 5 can be reduced, and the operation speed of the field-effect transistor can be increased.

Figure 22:
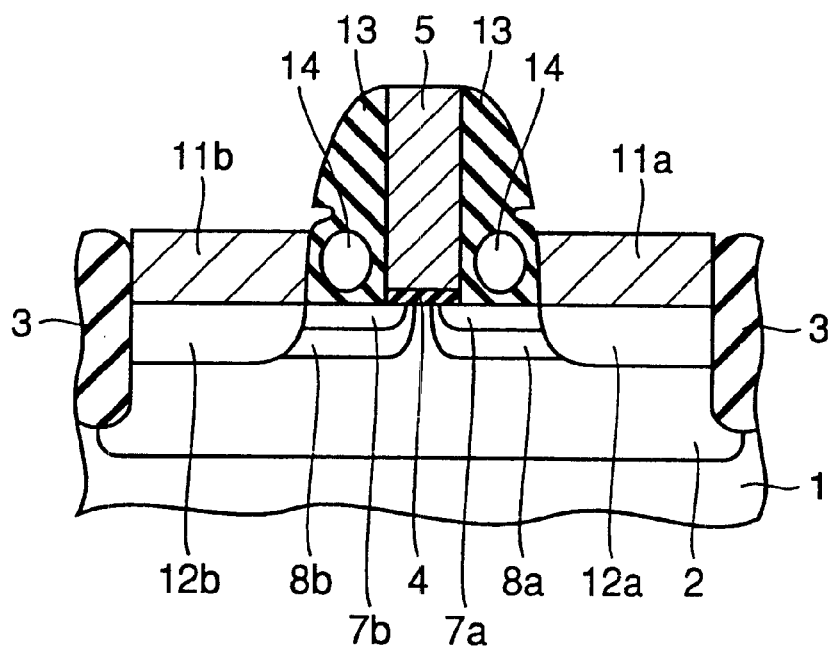
FIG. 22 is a cross section showing a step following the step shown in FIG. 21 in the fifth embodiment.

As shown in FIG. 22, top surface portions of silicon layers 11a and 11b, which are located closer to gate electrode 5, may be removed. Thereby, the leak current between silicon layers 11a and 11b and gate electrode 5 can be reduced, and the fringing capacitances between them can be further reduced.

Sixth Embodiment

Description will now be given on a method of manufacturing a semiconductor device according to a sixth embodiment of the invention as well as the semiconductor device manufactured by the method. First, steps similar to those of the first embodiment shown in FIGS. 1 to 4 are performed to form silicon layers 11a and 11b on the exposed surfaces of extension regions 7a and 7b, respectively.

Figure 23:
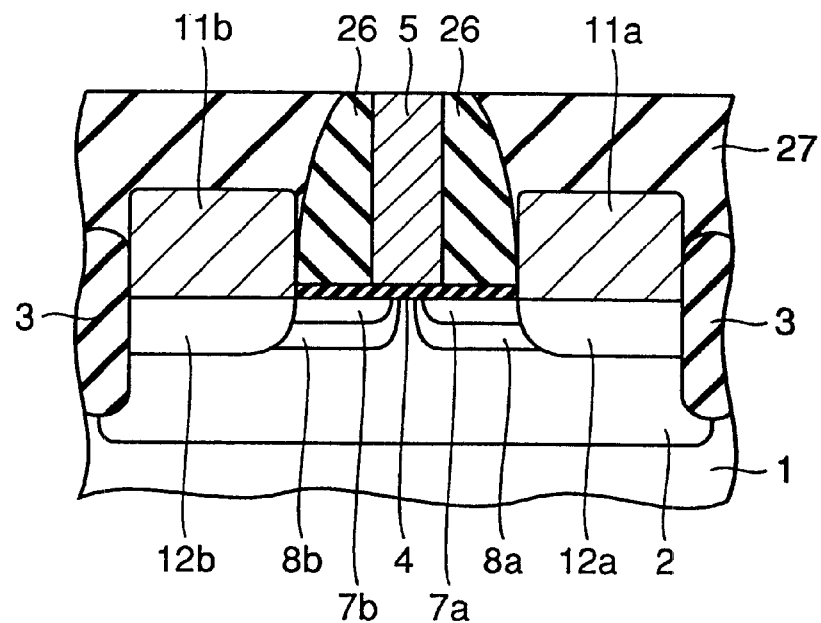
FIG. 23 is a cross section showing a step in a method of manufacturing a semiconductor device according to a sixth embodiment of the invention.

Sidewall insulating film 40 may be formed of a single layer of a dummy sidewall insulating film 26 as shown in FIG. 23. A step similar to that shown in FIG. 5 is performed to form source/drain regions 12a and 12b.

Then, as shown in FIG. 23, an interlayer insulating film 27 covering silicon layers 11a and 11b and gate electrode 5 is formed on silicon substrate 1. CMP (Chemical Mechanical Polishing) is effected on interlayer insulating film 27 to flatten the surface of interlayer insulating film 27. This processing is substantially performed until the top end of dummy sidewall insulating film 26 is slightly polished.

Figure 24:
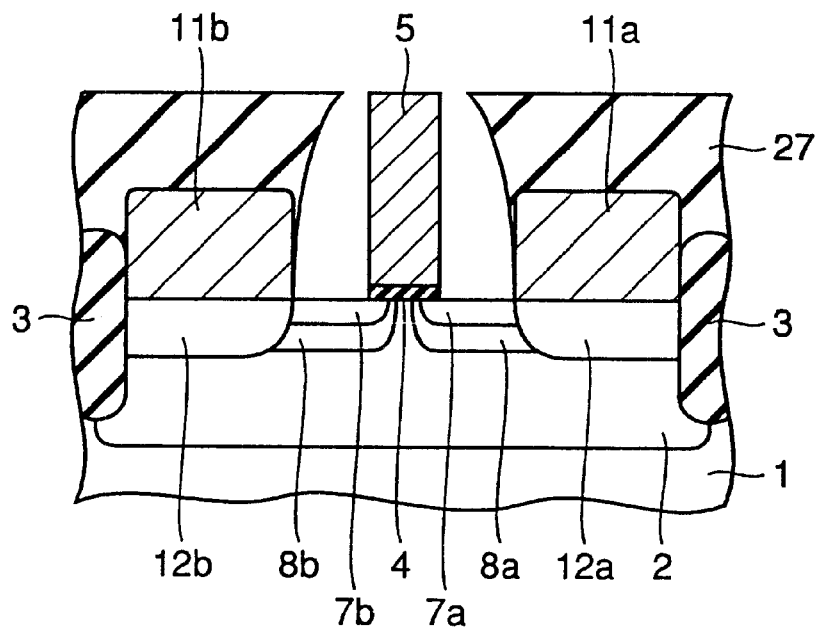
FIG. 24 is a cross section showing a step following the step shown in FIG. 23 in the sixth embodiment.
Figure 25:
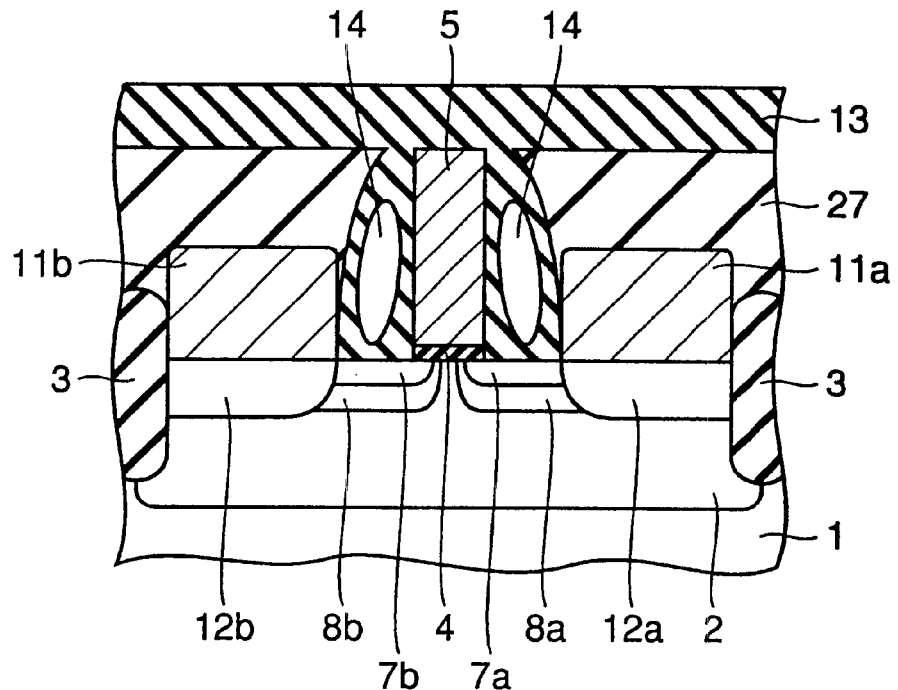
FIG. 25 is a cross section showing a step following the step shown in FIG. 24 in the sixth embodiment.

Thereafter, as shown in FIG. 24, dummy sidewall insulating film 26 is removed, e.g., by wet etching. Then, as shown in FIG. 25, silicon oxide film 13 is formed on interlayer insulating film 27 by the CVD method or the like.

In this state, the top surface portion of interlayer insulating film 27 is closer to gate electrode 5 than the other portion of interlayer insulating film 27. Therefore, silicon oxide film 13 may be formed under such conditions that silicon oxide film 13 is formed in a conformal fashion, whereby the spaces between silicon layers 11a and 11b and gate electrode 5 are covered at portions between the top surface portion of interlayer insulating film 27 and gate electrode 5 prior to the other portion. Therefore, voids 14 can be easily formed between silicon layers 11a and 11b and gate electrode 5.

As a result, the fringing capacitances between silicon layers 11a and 11b and gate electrode 5 can be reduced, and the operation speed of the field-effect transistor can be increased. Further, in this field-effect transistor, void 14 can be formed in and between the lower and upper portions of gate electrode 5 so that the fringing capacitance can be further reduced.

Seventh Embodiment

Figure 26:
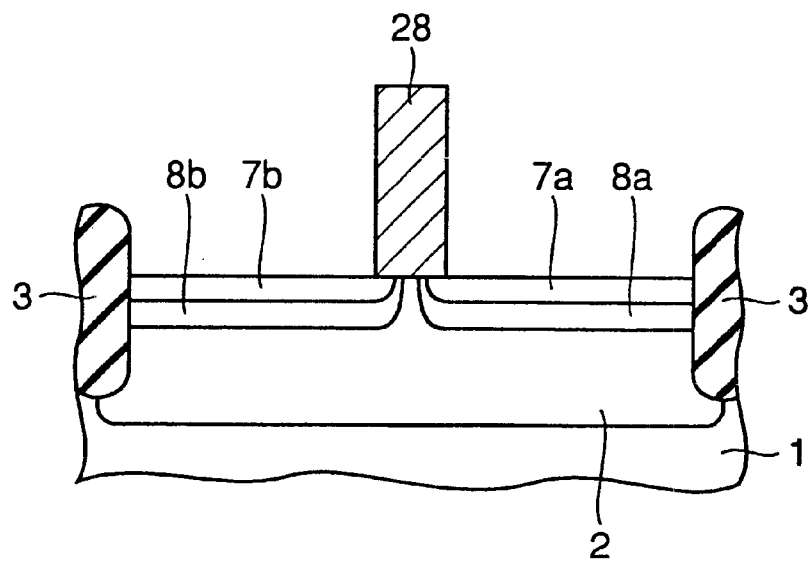
FIG. 26 is a cross section showing a step in a method of manufacturing a semiconductor device according to a seventh embodiment of the invention.

Description will now be given on a method of manufacturing a semiconductor device according to a seventh embodiment of the invention as well as the semiconductor device manufactured by the method. First, as shown in FIG. 26, a dummy electrode 28 is formed on silicon substrate 1. Using dummy gate electrode 28 as a mask, ions of a predetermined conductivity type are implanted to form pocket regions 8a and 8b as well as extension regions 7a and 7b. Thereafter, predetermined heat treatment is performed.

Figure 27:
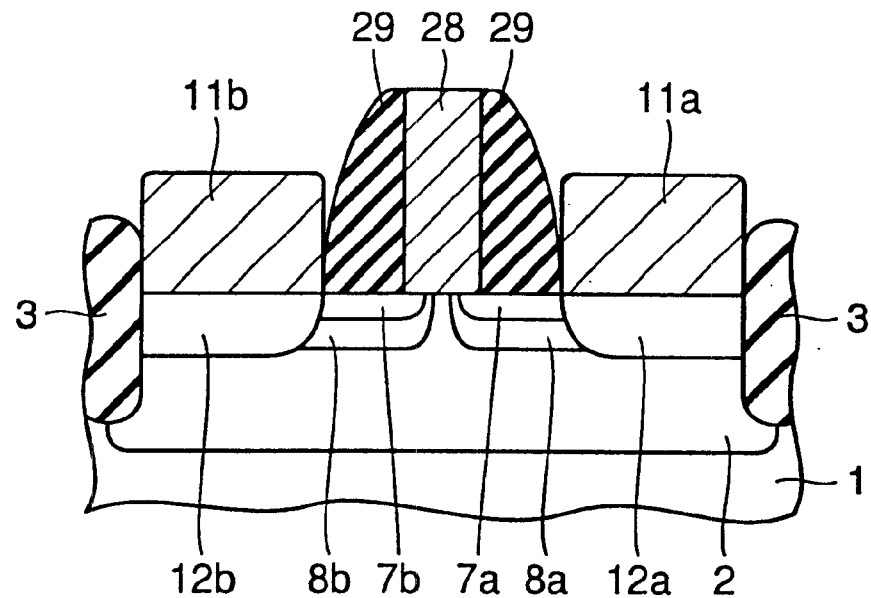
FIG. 27 is a cross section showing a step following the step shown in FIG. 26 in the seventh embodiment.

Then, a silicon nitride film covering dummy gate electrode 28 is formed on silicon substrate 1. By effecting anisotropic etching on the silicon nitride film, dummy sidewall insulating films 29 are formed on side surfaces of dummy gate electrode 28 as shown in FIG. 27, respectively.

On the exposed surfaces of extension regions 7a and 7b, silicon layers 11a and 11b are formed by the silicon selective epitaxial growth method, respectively. Each of silicon layers 11a and 11b preferably has thickness T, which is substantially two or more times larger than width W of dummy sidewall insulating film 29.

Thereafter, impurities of a predetermined conductivity type are implanted into silicon layers 11a and 11b by the ion implanting method, and heat treatment is effected to form source/drain regions 12a and 12b, respectively.

Figure 28:
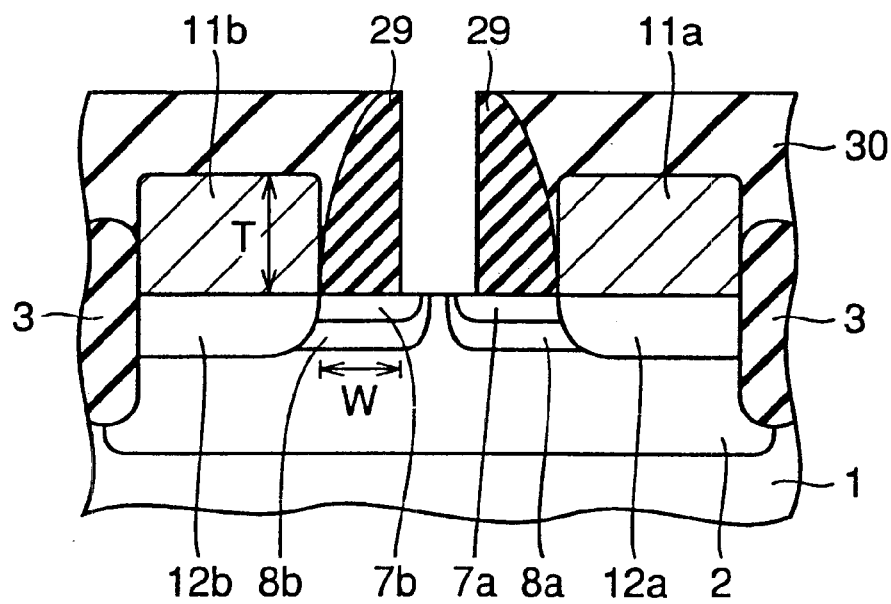
FIG. 28 is a cross section showing a step following the step shown in FIG. 27 in the seventh embodiment.

Then, processing is performed to form a silicon oxide film or the like, which is located on silicon substrate 1, and covers silicon layers 11a and 11b, dummy gate electrode 28 and dummy sidewall insulating film 29. The CMP is effected on the silicon oxide film thus formed so that a silicon oxide film 30 having a flattened surface is formed as shown in FIG. 28. It is desirable that this CMP is substantially performed until the top surface of dummy gate electrode 28 is exposed. Thereafter, dummy gate electrode 28 is removed by wet etching.

Figure 29:
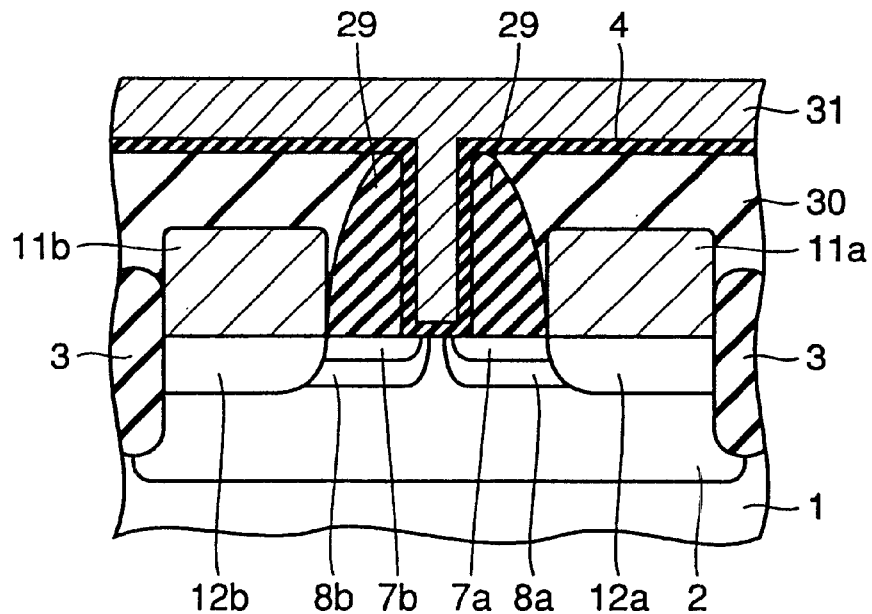
FIG. 29 is a cross section showing a step following the step shown in FIG. 28 in the seventh embodiment.

Then, as shown in FIG. 29, silicon oxide film 4, which will form a gate insulating film, is formed. A metal film 31, which is made of tungsten, copper or the like, and will form a gate electrode, is formed on silicon oxide film 4. Thereafter, the CMP is effected to remove a portion of the metal film 31 and a portion of silicon oxide film 4 located on the top surface of silicon oxide film 30.

Figure 30:
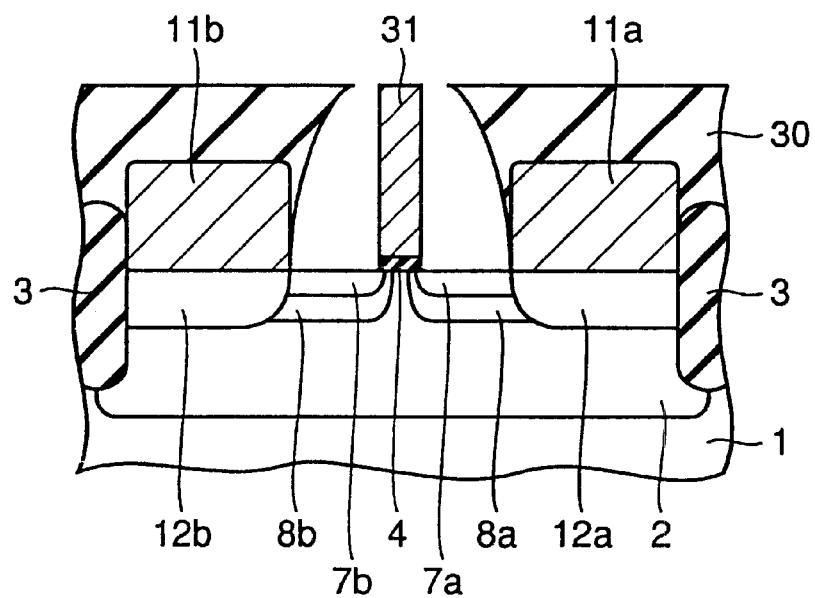
FIG. 30 is a cross section showing a step following the step shown in FIG. 29 in the seventh embodiment.
Figure 31:
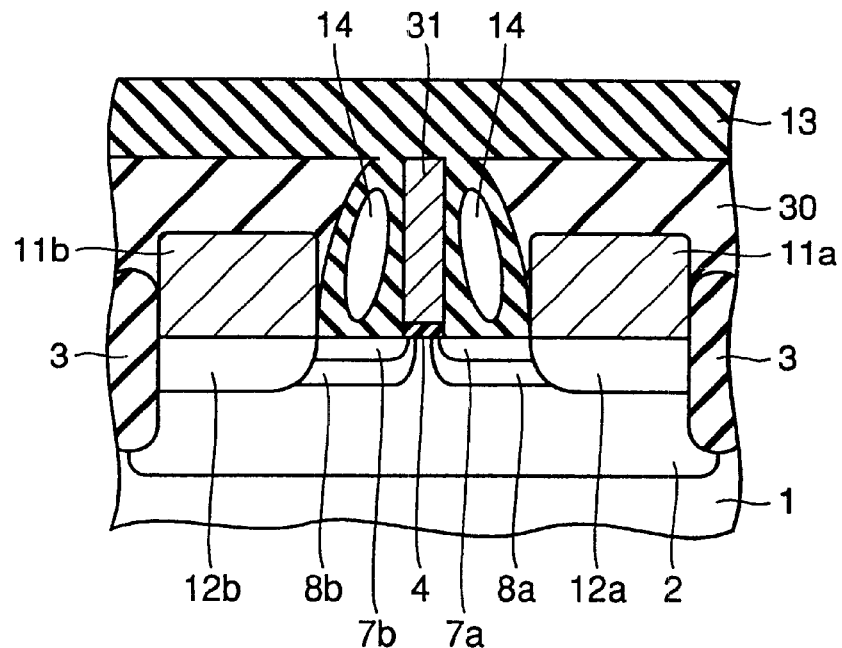
FIG. 31 is a cross section showing a step following the step shown in FIG. 30 in the seventh embodiment.
Figure 32:
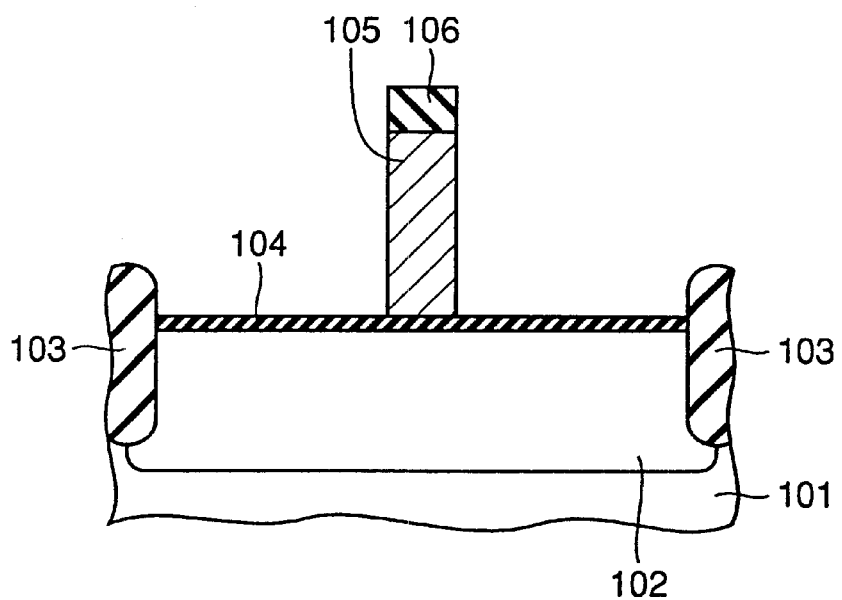
FIG. 32 is a cross section showing a step in a method of manufacturing a semiconductor device in the prior art.
Figure 33:
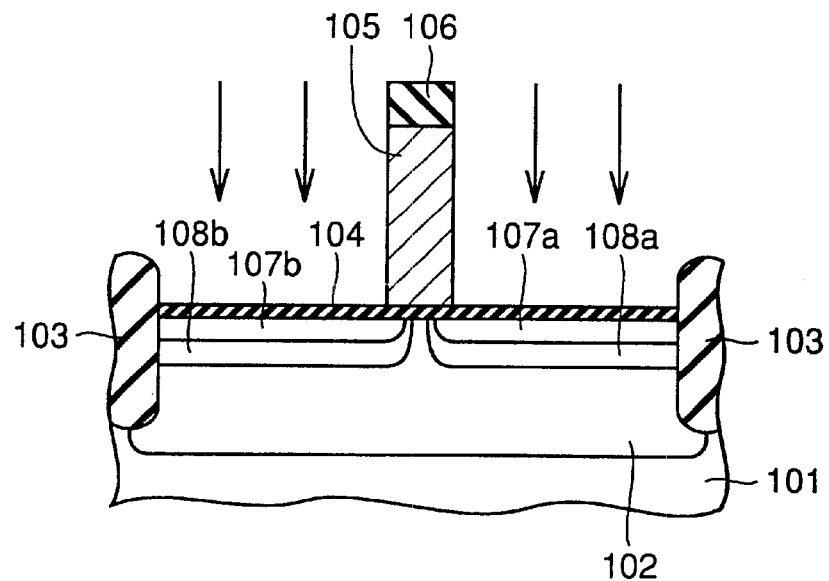
FIG. 33 is a cross section showing a step following the step shown in FIG. 32.
Figure 34:
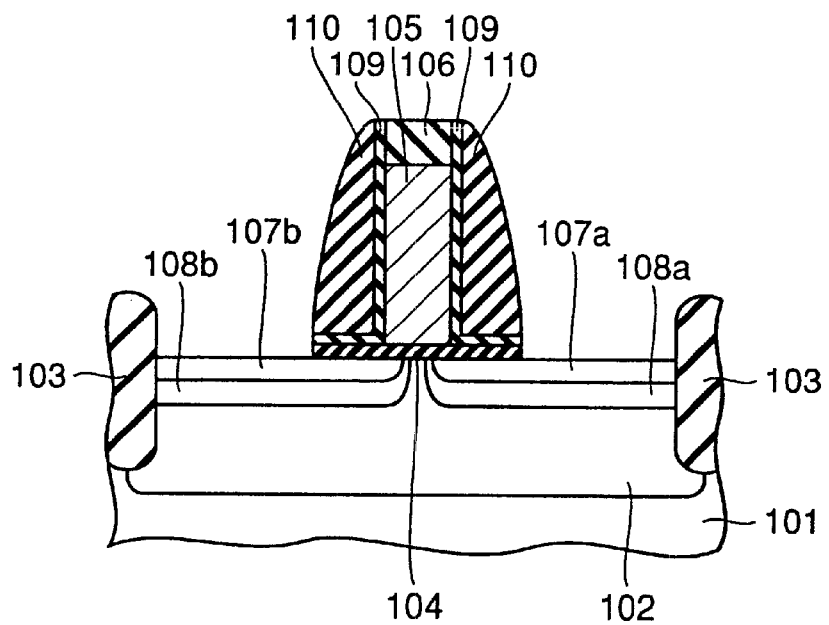
FIG. 34 is a cross section showing a step following the step shown in FIG. 33.
Figure 35:
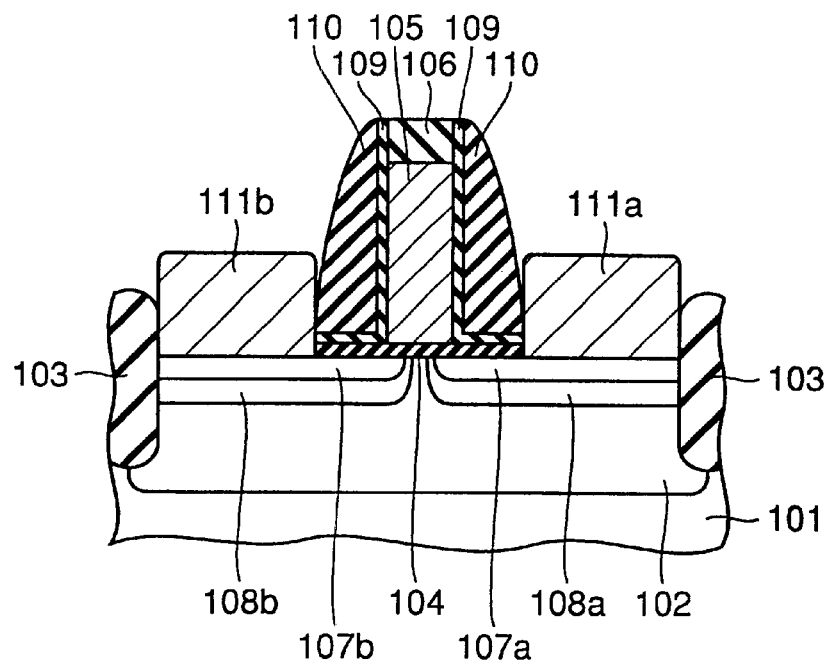
FIG. 35 is a cross section showing a step following the step shown in FIG. 34.
Figure 36:
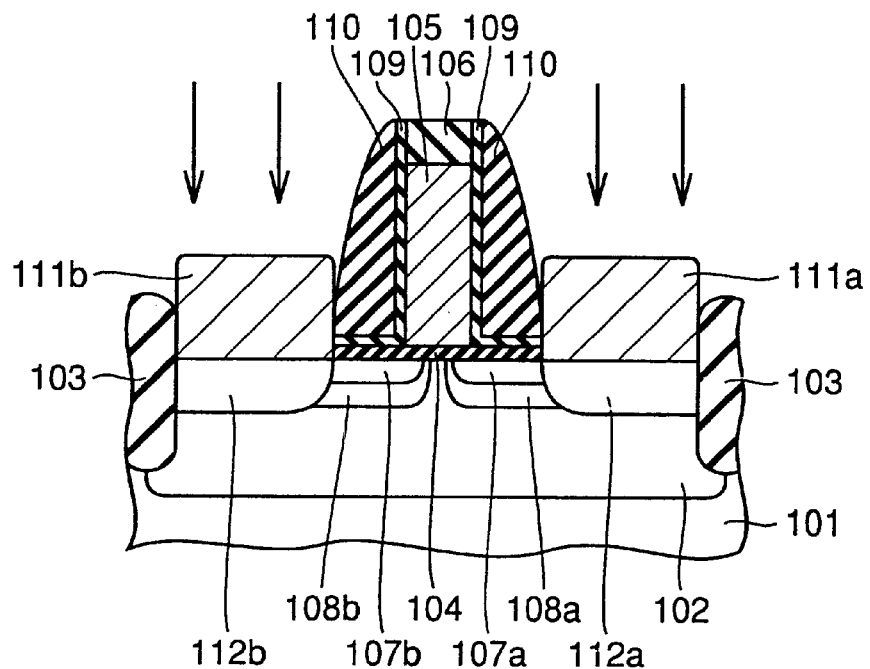
FIG. 36 is a cross section showing a step following the step shown in FIG. 35.

Then, as shown in FIG. 30, wet etching is effected to remove dummy sidewall insulating film 29. Then, silicon oxide film 4 formed on each side surface of gate electrode 31 is removed. Thereafter, as shown in FIG. 31, silicon oxide film 13, which will form the sidewall insulating film, is formed, e.g., by the CVD on silicon oxide film 30.

In this state, the top surface portion of interlayer insulating film 30 is closer to gate electrode 5 than the other portion of interlayer insulating film 30. Therefore, silicon oxide film 13 may be formed under such conditions that silicon oxide film 13 is formed in a conformal fashion, whereby the spaces between silicon layers 11a and 11b and gate electrode 31 are covered at portions between the top surface portions of interlayer insulating film 30 and gate electrode 31 prior to the others. Therefore, voids 14 can be easily formed between silicon layers 11a and 11b and gate electrode 31.

As a result, the fringing capacitances between silicon layers 11a and 11b and gate electrode 5 can be reduced, and the operation speed of the field-effect transistor can be increased. Further, void 14 can be located in and between the lower and upper portions of gate electrode 31 so that the fringing capacitance can be further reduced.

In the manufacturing method described above, since silicon oxide film 4 forming the gate insulating film is formed after formation of source/drain regions 12a and 12b, the gate insulating film made of a material of a higher dielectric constant can be formed by the CVD.

Since the gate electrode is made of metal such as tungsten, the resistance of the gate electrode can be low, and depletion in the gate can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a gate electrode on a surface of a semiconductor substrate with a gate insulating film between said gate electrode and said semiconductor substrate, said gate electrode having a wider portion and a narrower portion and including an upper layer of silicon and a lower layer of silicon-germanium, said upper layer including said wider portion and said lower layer including said narrower portion;

sidewall insulating films located on and in contact with opposite side surfaces of said gate electrode; and source and drain regions in first and second regions of said semiconductor substrate, spaced from each other, with said gate electrode and said sidewall insulating films between said source and drain regions, each of said source and drain regions including a portion at the surface of said semiconductor substrate and a raised portion on a surface of said portion at the surface of said semiconductor substrate, wherein said wider portion of said gate electrode is located closer to said raised portion than said narrower portion of said gate electrode, and said sidewall insulating films are located between and have respective thicknesses between said raised portions and said gate electrode, and include respective voids, lowering capacitance between said gate electrode and said raised portions.

2. The semiconductor device according to claim 1, wherein said raised portion has a height, with respect to the surface of said semiconductor substrate, at least twice the thickness of said sidewall insulating films.

3. The semiconductor device according to claim 1, wherein said wider portion of said gate electrode has a lower end located substantially at a level no higher, with respect to the surface of said semiconductor substrate, than a top surface of said raised portion.

4. A semiconductor device comprising:

a gate electrode on a surface of a semiconductor substrate with a gate insulating film between said gate electrode and said semiconductor substrate;

sidewall insulating films located on and in contact with opposite side surfaces of said gate electrode; and source and drain regions in first and second regions of said semiconductor substrate, spaced from each other, with said gate electrode and said sidewall insulating films between said source and drain regions, each of said source and drain regions including a portion at the surface of said semiconductor substrate and a raised portion on a surface of said portion at the surface of said semiconductor substrate, wherein said sidewall insulating films are located between and have respective thicknesses between said raised portions and said gate electrode, and include respective voids, lowering capacitance between said gate electrode and said raised portions, said gate electrode extends further from the surface of said semiconductor substrate than said raised portions, and the voids are disposed in portions of said sidewall insulating films no further from the surface of said semiconductor substrate than said raised portions.

5. The semiconductor device according to claim 4, wherein said sidewall insulating films consist of respective single layers.

6. The semiconductor device according to claim 4, wherein said raised portion has a height, with respect to the surface of said semiconductor substrate, at least twice the thickness of said sidewall insulating films.

7. The semiconductor device according to claim 4, wherein said gate electrode has a wider portion and a narrower portion, said wider portion being located closer to said raised portion than said narrower portion.

8. The semiconductor device according to claim 7, wherein the voids are located closer to the surface of said semiconductor substrate than said wider portion of said gate electrode.

9. The semiconductor device according to claim 7, wherein said wider portion has a lower end located at a level equal to or lower than a top surface of said raised portion.

10. The semiconductor device according to claim 7, wherein said wider portion of said gate electrode has a lower end located substantially at a level no higher, with respect to the surface of said semiconductor substrate, than a top surface of said raised portion.

* * * * *